United States Patent [19]
Hayashi et al.

[11] Patent Number: 5,283,496
[45] Date of Patent: Feb. 1, 1994

[54] THICKNESS SHEAR CRYSTAL RESONATOR AND MANUFACTURING METHOD THEREFOR

[75] Inventors: Hitoaki Hayashi, Tokyo; Isao Mutai, Kamiina, both of Japan

[73] Assignee: Asahi Dempa Co., Ltd., Tokyo, Japan

[21] Appl. No.: 813,048

[22] Filed: Dec. 23, 1991

Related U.S. Application Data

[60] Division of Ser. No. 590,059, Sep. 28, 1990, abandoned, which is a continuation of Ser. No. 321,166, Mar. 9, 1989, abandoned.

[30] Foreign Application Priority Data

Jul. 20, 1988 [JP] Japan .................. 63-178950

[51] Int. Cl.$^5$ .................................. H01L 41/08
[52] U.S. Cl. ........................... 310/312; 29/25.35; 310/367; 310/369
[58] Field of Search ............... 310/311, 312, 360, 361, 310/367-369; 29/25.35

[56] References Cited

U.S. PATENT DOCUMENTS

| | | | |
|---|---|---|---|
| 2,392,429 | 1/1946 | Sykes | 310/312 |
| 2,446,443 | 8/1948 | Tibbetts | 310/312 X |
| 2,705,392 | 4/1955 | Imler | 310/312 X |
| 3,384,768 | 5/1968 | Shockley | 310/312 X |
| 3,569,750 | 5/1971 | Beaver | 310/312 X |
| 4,188,557 | 2/1980 | Mattuschka | 310/369 X |
| 4,530,139 | 7/1985 | Miller | 310/312 |
| 4,638,536 | 1/1987 | Vig | 310/312 X |

FOREIGN PATENT DOCUMENTS

2256624C3 5/1973 Fed. Rep. of Germany .
2806435 5/1979 Fed. Rep. of Germany .

*Primary Examiner*—Mark O. Budd
*Attorney, Agent, or Firm*—Stevens, Davis, Miller & Mosher

[57] ABSTRACT

A thickness, shear crystal resonator and a method of manufacturing therefor in which a natural crystal surface is appeared on at least a part of surfaces of crystal plate thereof to the extent that the part is made substantially transparent, the impedance of the crystal resonator is made small thereby and a large Q factor can be obtained. And, there is found no dip in the temperature characteristics of the impedance and the vibrating frequency of the crystal resonator.

2 Claims, 11 Drawing Sheets

FIG_1 PRIOR ART

FIG_2 PRIOR ART

FIG_3 PRIOR ART

FIG_4 PRIOR ART

FIG_5 PRIOR ART

FIG_6A

FIG_6B

FIG_7

FIG_8

FIG_9A

FIG_9B

FIG_9C

FIG_11A

FIG_11B

FIG_11C

FIG_12A

FIG_12B

FIG_12C

FIG_13C

FIG_13D

FIG. 14

THICKNESS SHEAR CRYSTAL RESONATOR AND MANUFACTURING METHOD THEREFOR

This application is a division of application Ser. No. 590,059, filed Sep. 28, 1990 (abandoned) which is turn is a continuation of application Ser. No. 321,166, filed Mar. 9, 1989 (abandoned).

BACKGROUND OF THE INVENTION

1. Field of the Invention and the Related Art Statement

The present invention relates to a crystal resonator vibrating in a thickness-shear mode, and more particularly to a thickness shear crystal resonator having a large Q factor with smooth temperature characteristics. The present invention also relates to a method of manufacturing said thickness shear crystal resonator.

Figure 1:
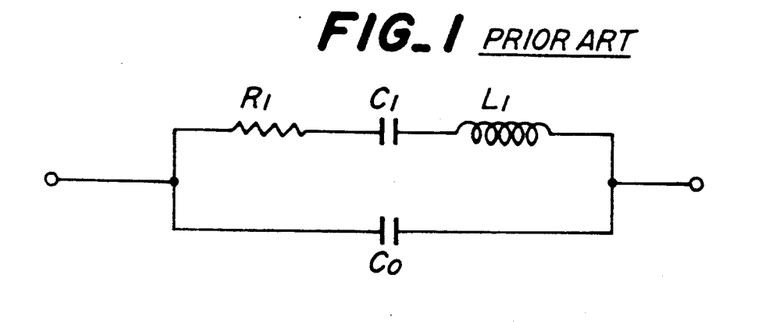
FIG. 1 is a diagram showing an equivalent circuit of the crystal resonator.

FIG. 1 shows an electric equivalent circuit of the thickness shear crystal resonator comprising a crystal plate and a pair of electrodes directly applied on opposite surfaces thereof The Q factor (figure of merit), which represents the efficiency of vibration of such a crystal resonator, is expressed by the following equation (1):

$$Q = \frac{1}{2\pi \cdot f \cdot C_1 \cdot R_1} \quad (1)$$

wherein, f represents a vibration frequency, $C_1$ a capacitance of the crystal resonator, and $R_1$ an impedance of the crystal resonator, which represents a resistance against the vibration of the crystal resonator. In order to make large the Q factor of the crystal resonator vibrating at a specified frequency, it is necessary to make the capacitance $C_1$ and/or the impedance $R_1$ of the crystal resonator small. The vibrating frequency f of the crystal resonator, for example, a thickness shear resonator made of AT cut quartz, is expressed by $f \approx 1660 \times n/t$, wherein the unit of the frequency f is KHz, n represents the order of vibration, which is equal to 1 for the fundamental wave and is equal to 3, 5 . . . for the 3rd, 5th . . . overtones, and t represents a thickness of the crystal plate whose unit is expressed by mm. Since the order of vibration is predetermined, the vibrating frequency f of the thickness shear crystal resonator depends on the thickness t of the crystal plate. Therefore, in order to decrease the capacitance $C_1$ of the crystal resonator vibrating at the given frequency for obtaining the crystal resonator having a large Q factor, the size of the electrodes arranged on opposite surfaces of the crystal plate should be made small. However, there is a limitation in reducing the size of electrodes in the thickness shear crystal resonator due to the following reason.

Figure 2:
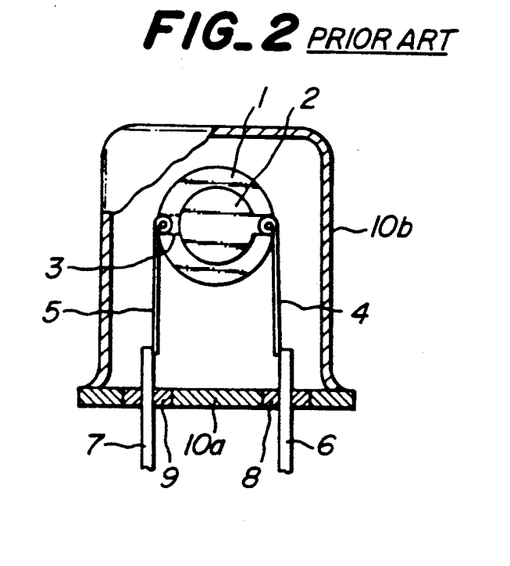
FIG. 2 is a schematic view illustrating the construction of the conventional thickness shear crystal resonator.
Figure 3:
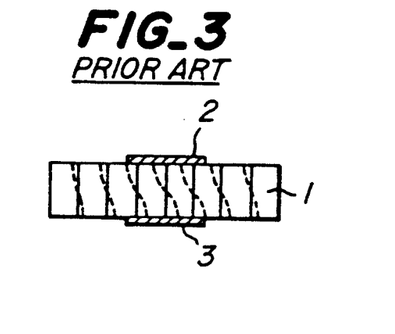
FIG. 3 is a schematic view representing the vibrating mode of the thickness shear crystal resonator.

FIG. 2 is a schematic view showing the general construction of a known thickness shear crystal resonator in which the electrodes are applied on the opposite surfaces of the crystal plate. In this crystal resonator, electrodes 2, 3 are provided on front and rear surfaces of a crystal plate 1 such that they are opposite to each other. The crystal plate 1 is held by supporting wires 4, 5 made of electrically conductive material and these wires are coupled with said electrodes 2, 3, respectively. These supporting wires 4, 5 are respectively connected to terminals 6, 7, which are fixed to a metal base 10a via insulators 8, 9. The base 10a is covered with a metal cover 10b, and the space formed by the base 10a and the cover 10b is filled with an inert gas. In general, the electrodes 2, 3 arranged on the opposite surfaces of the crystal plate 1 are formed by the vacuum evaporation. In the thickness shear crystal resonator, the crystal plate 1 vibrates or deviates in the direction parallel to the plane of the electrodes. When the crystal resonator vibrates in such thickness shear mode, a part of the crystal plate located between the opposite electrodes tends to deviate from each other by applying the electric power across the electrodes, but the remaining part of plate in the peripheral portion, on which electrodes are not arranged, works to resist against the deviation of the crystal part located between the electrodes. Therefore, in the crystal resonator having the crystal plate of a given dimension, if the size of electrodes is made small in order to decrease the capacitance $C_1$ for obtaining the large Q factor, the impedance $R_1$ will be naturally large, and it will be impossible to obtain the large Q factor. Thus, it is considered to make the electrodes as well as the peripheral portion of the crystal plate 1 on which the electrodes are not formed small as possible. However, in order to electrically isolate the electrode 2 formed on one surface of the crystal plate and the supporting wire 5 coupled therewith from the electrode 3 formed on the other surface of the crystal plate and the supporting wire 5 coupled therewith, the peripheral portion must have a certain width. Generally, the width of 1~2 mm is required for the peripheral portion of the crystal resonator. It is apparent from the above that there is a limitation to make the capacitance $C_1$ of the crystal resonator small by reducing the size of electrodes.

On the other hand, the impedance $R_1$ of the crystal resonator has a characteristic different from that of the resistance of general electric circuits. It represents a resistance against the mechanical vibration of the crystal plate. The causes for such resistance have not been solved completely yet, but the following four factors have been considered. The first factor is that the crystal located in the peripheral portion of the crystal resonator, on which the electrodes are not arranged, restricts the vibration of the crystal located in the central portion, on which the electrodes are provided, the second factor is that the supporting wires restrict the vibration, the third factor is that the phase of the vibration of the crystal located between the electrodes is deviated from the phase of the vibration reflected from the side edge of the crystal plate, and the fourth factor is that several kinds of defects generated in the crystal plate during the manufacturing process serve as the resistance. Under the situation mentioned above, various solutions have been suggested for making the impedance of the thickness shear crystal resonator small, hitherto. However, the fully satisfied solution has not been suggested yet, as explained in the following.

Figure 4:
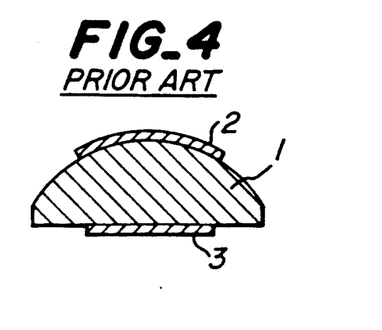
FIG. 4 is a cross sectional view depicting the conventional plano-convex type crystal resonator.

FIG. 4 shows a conventional crystal resonator, in which a crystal plate 1 is formed into a plano-convex, i.e. one surface of the crystal plate is formed as a convex surface and the other surface is formed as a plane surface, and the both surfaces are polished to become like a mirror surface. Such a plano-convex type crystal resonator is disclosed in U.S. Pat. No. 4,188,557. In such crystal resonator, it is possible to concentrate the vibrating energy into the center of the crystal resonator and the displacement of the peripheral portion becomes almost zero, so that the resistance caused by the first factor mentioned above can be reduced. And, since it is also possible to reduce the coupling of high-order contour signals, which is determined by the thickness and contour of the crystal plate, the resistance caused by the second factor can be decreased. Further, the both surfaces of the crystal plate are formed to become like a mirror surface, the resistance caused by the fourth factor can be also reduced. Therefore, the Q factor of this plano-convex type crystal resonator becomes high, but it has a serious drawback that the manufacturing process therefor is complex and thus the cost for manufacturing becomes high because at least one of the surface of the crystal plate should be ground into the convex shape. Therefore, the application of the plano-convex type crystal resonator is practically restricted to such an extent that the economical problem need not be discussed.

Figure 5:
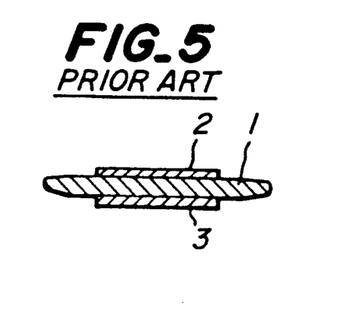
FIG. 5 is a cross sectional view depicting the conventional crystal resonator the edge of which is tapered by beveling.

FIG. 5 shows another embodiment of the conventional crystal resonator, in which the impedance $R_1$ is made small. In this embodiment, the peripheral edge of the crystal resonator 1 is beveled to form a tapered edge by lapping. Also in such a crystal resonator having the beveled edge, the displacement of vibration is concentrated in the central portion of the crystal plate and the loss due to the supporting wires at the edge of the crystal plate can be reduced. However, there is a limitation to make the impedance $R_1$ small by conducting the beveling treatment to the peripheral edge of the crystal plate, and in case of the crystal resonator vibrating at a higher frequency, the beveling process becomes extremely difficult and further the effect of the beveling does not appear so remarkably. As stated above, the vibrating frequency f of the crystal resonator is predominantly determined by the thickness of the crystal plate 1. For example, the thickness of the crystal plate is 1.66 mm at the fundamental frequency of 1 MHz. And if the frequency is 10 MHz, the thickness becomes 0.166 mm. As apparent from this, as the vibrating frequency becomes higher, the thickness of the crystal plate becomes thinner. Thus, the beveling treatment could not be conducted to the crystal resonator having the frequency of about 10 MHz or more, generally.

Another method of making the impedance $R_1$ small has been suggested in which the lapping treatment is conducted for forming the both surfaces of the crystal plate into the mirror surfaces. Generally, the crystal plate is lapped by means of abrasive grains after the plate being cut in the given orientation of the crystal. In the beginning of the lapping, coarse grains are used, and in the end, fine grains are used. The mesh size of grains for use in finishing is about #2500–#4000, whose diameter is about several microns. The grain size for use in finishing is determined by taking into consideration the necessary performance of the resonator in practical use and the cost therefor. If the crystal plate is lapped by using very fine abrasive grains without considering economical efficiency to obtain the mirror finished surface, the fourth factor will be reduced and the impedance $R_1$ will become small to some extent. However, the cost therefor will be extremely expensive and not in practice. Furthermore, in the mechanical lapping using the grains, there is generated affected ground layers in the surfaces of the crystal plate, so that there is a limitation in making the impedance $R_1$ small.

Furthermore, it is also suggested to conduct an etching treatment on the crystal plate in such manner that the whole crystal plate is immersed in an etching liquid, for example, a solution of ammonium fluoride, in order not only to reduce the impedance $R_1$ but also to reduce the age variation of the vibration frequency by removing the affected ground layer generated in the surface of the crystal plate or by removing dirt or stain on the surface of the crystal plate. The impedance $R_1$ can be made small by such etching treatment. However, if the surface of the crystal plate is over etched, the surface becomes rough, and the impedance $R_1$ is increased. Further, not only the peripheral portion but also the central portion on which the electrodes are to be arranged are etched, so that the adhesive force of the electrodes to the surfaces of the crystal plate becomes weak. Moreover, a desired thickness of the crystal plate cannot be obtained, and the vibration frequency thereof might be shifted.

The thickness shear crystal resonators manufactured in a mass production scale are produced by such a way of cutting a crystal plate into a given shape, polishing the cut crystal plate by using abrasive grains, and beveling the edge of the crystal plate, and etching the whole polished surfaces of the crystal plate, so that the impedance $R_1$ of the crystal plate is decreased within an allowable range and the Q factor becomes large.

However, the demands of the users for the performance and cost of the crystal resonators have become severe. Therefore, it is now difficult to satisfy the user's demands, even if the manufacturing technique mentioned above is used for manufacturing the crystal resonator. That is to say, the user requires to make the impedance of the crystal resonator much smaller.

Moreover, in the temperature characteristics of the impedance $R_1$, a non-continued variation, which is so-called dip, is found. This dip is related to a dip of the temperature characteristics of the frequency of the crystal resonator, and thus it is difficult to compensate. Therefore, it is also required by the user that the crystal resonator whose temperature characteristics of the impedance $R_1$ or frequency has no dip is developed and that the manufacturing cost becomes low.

SUMMARY OF THE INVENTION

The present invention has for its primary object to provide the thickness shear crystal resonator in which all the drawbacks mentioned above are removed, i.e. the impedance $R_1$ is small, thus the Q factor is large, there is no dip in the temperature characteristics thereof, and the crystal resonator vibrates stably at a desired frequency.

The other object of the present invention is to provide a method of manufacturing the thickness shear crystal resonator as mentioned above easily and low in cost.

The thickness shear crystal resonator according to the invention comprises:
a crystal plate having front and rear surfaces opposite to each other; and
a pair of electrodes each applied on the front and rear surfaces of said crystal plate respectively, in at least a part of peripheral portion of said surfaces of the crystal plate where said electrodes are not arranged, free crystal surfaces are exposed to such an extent that said part of peripheral portion is substantially transparent.

According to the thickness shear crystal resonator of the present invention, in all or a part of the surfaces of the crystal plate on which the electrodes are not provided, raw crystal surfaces are exposed, so that the surfaces are substantially transparent. Thus, the affected layer including the plastic deformation layer, the residual stress layer and the secondly crack is almost removed from the surfaces of the crystal plate. Therefore, the resistance caused by the fourth factor can be made sufficiently small, as well as the resistance by the first factor can be made small because the mass of the part of the crystal resonator, where electrodes are not arranged, becomes small. Furthermore, since the affected layer is removed from the surfaces, the temperature characteristics of the impedance $R_1$ and the frequency of the crystal resonator become stable and therefore any dips are not found.

The method for manufacturing the thickness shear crystal resonator according to the present invention comprises the steps of:

conducting a chemical or physical etching on at least a part of a surface of a crystal plate with the exception of a portion on which electrodes are to be applied to remove the affected layer of said part of the surface to such an extent that free crystal surfaces are exposed and said part becomes substantially transparent.

According to the method of the present invention, since the physical or chemical etching does not generate the affected layer, the crystal resonators having excellent characteristics can be manufactured easily and low in cost.

DETAILED DESCRIPTION OF THE PREFERRED EMBODIMENTS

Figure 6A:
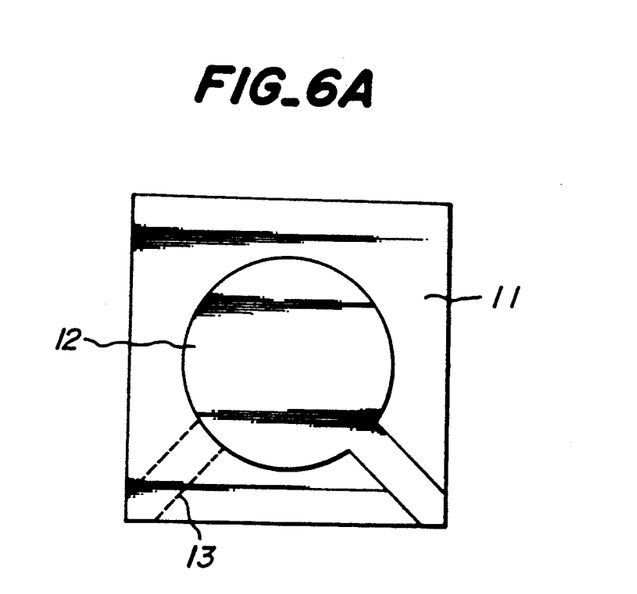
FIG. 6A is a plan view illustrating one embodiment of the thickness shear crystal resonator according to the present invention.
Figure 6B:
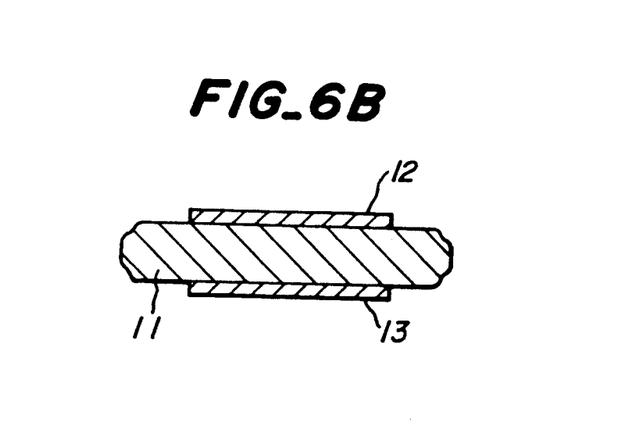
FIG. 6B is a cross sectional view showing the construction of the crystal resonator shown in FIG. 6A.

FIGS. 6A and 6B are schematic view and cross sectional view illustrating the construction of one embodiment of the thickness shear crystal resonator according to the present invention. In these figures, only a crystal plate 11 and electrodes 12 and 13 arranged on opposite surfaces thereof are illustrated. The crystal plate 11 has a shape of square of 5.4 mm × 5.4 mm with the thickness of 0.166 mm. The diameter of the each electrodes 12, 13 is 3.7 mm. The edge portion of the crystal plate 11 is beveled such that a peripheral portion situated inside from the edge of the crystal plate 11 by 0.7 mm is tapered. The etching treatment is conducted on a part of surfaces of the crystal plate 11 where the electrodes are not to be arranged, by using a liquid of ammonium fluoride to the extent that free crystal surfaces of quartz, i.e. the natural surface of the crystal are exposed. In FIG. 6B, the thickness of the crystal plate 11 is illustrated in enlarged scale in order to give a clear interruption. Such crystal resonator generates the fundamental wave at the vibration frequency of 10 MHz.

Figure 7:
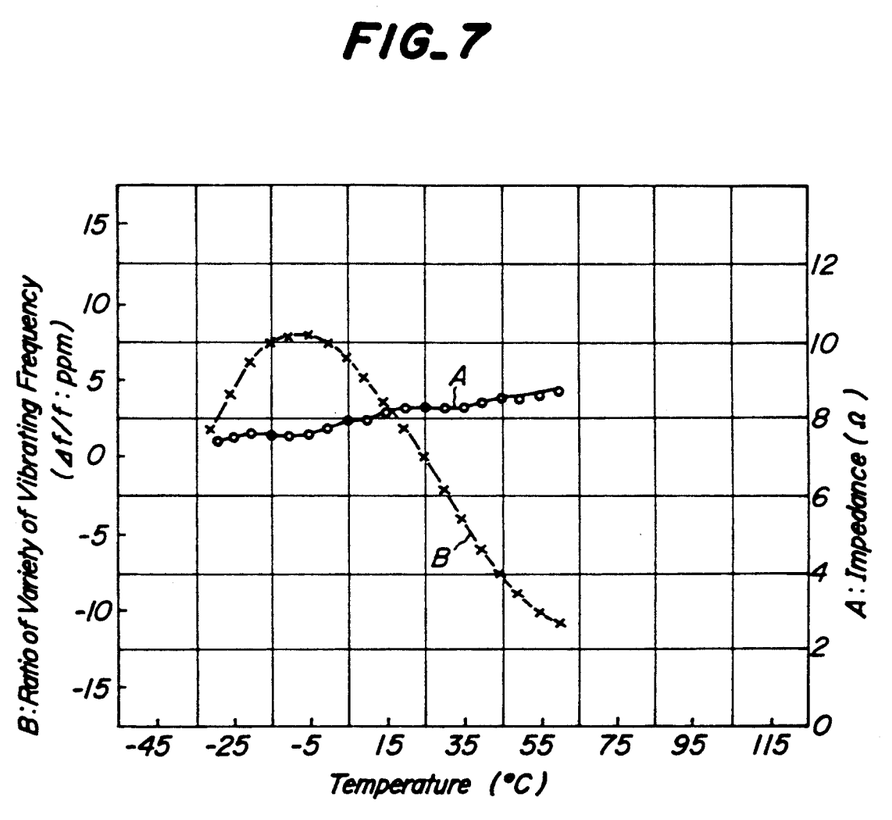
FIG. 7 is a graph representing the temperature characteristics of the impedance and the ratio of variety of the vibrating frequency of the thickness shear crystal resonator according to the embodiment shown in FIG. 6.

Curves A and B shown in FIG. 7 show the temperature characteristics of the ratio of variation of the vibrating frequency ($\Delta f/f$) and the impedance $R_1$ of the crystal resonator according to the above first embodiment of the present invention. The curve A shows that the impedance is small and lies within a range of about 7.4~8.8$\Omega$, that no dip is found in the temperature characteristics of the impedance, and that the variation of the impedance due to the temperature is also small. Furthermore, the curve B shows that the ratio of variation of the vibration frequency for the temperature is about +7 ppm to −10 ppm, which is also small.

Figure 8:
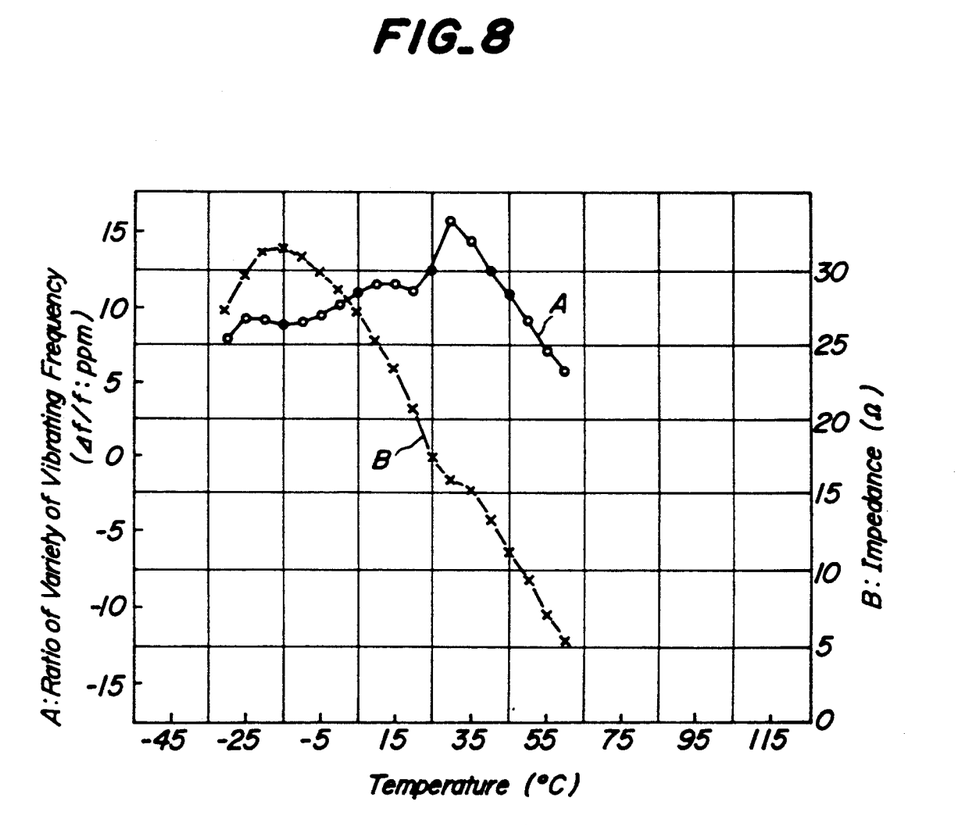
FIG. 8 is a graph representing the temperature characteristics of the conventional crystal resonator.

Curves A and B shown in FIG. 8 represent the temperature characteristics of the conventional crystal resonator in which the peripheral portions of the surfaces of the crystal plate are not etched. The curve A in FIG. 8 shows that in the conventional crystal resonator the impedance is about 25~30$\Omega$, which is about three times larger than that of the crystal resonator of the present invention, and that the impedance is suddenly varied in accordance with the temperature, i.e. the dip is found. And, the curve B in FIG. 8 shows that the ratio of variation of the vibrating frequency is about +15 ppm~−15 ppm, which is larger than that of the present invention, and that the curve B is not smooth.

Figure 9A:
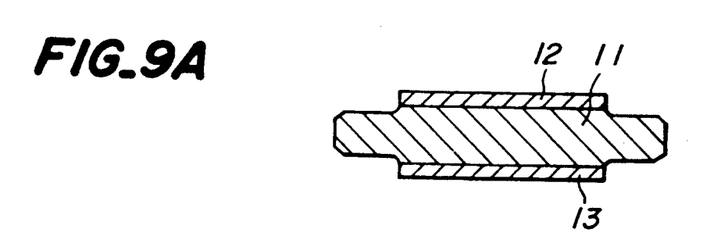
FIGS. 9A, 9B and 9C are cross sectional views illustrating the other embodiments of the crystal resonator according to the present invention.
Figure 9B:
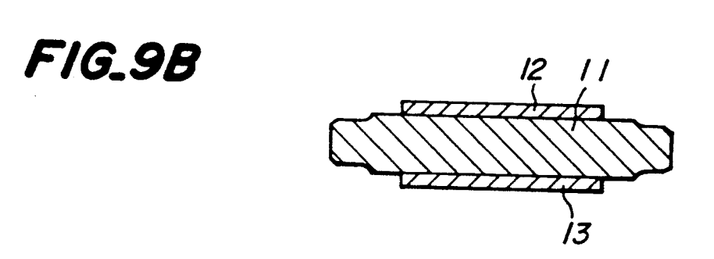
Figure 9C:
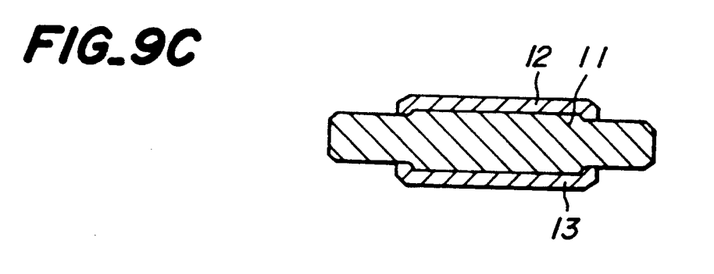

In the first embodiment of the thickness shear crystal resonator according to the present invention, the etching treatment is conducted on the beveled peripheral portion of the crystal plate 11 only, but it may be extended to the intermediate flat portion between the beveled portion and the portion covered with the electrodes 12, 13 as shown in FIG. 9A. And, it may be also possible to conduct the etching treatment partially on the flat portion as illustrated in FIG. 9B. Further the etching may be effected up to a part of the flat portion which is covered with the electrodes 12, 13 as shown in FIG. 9C. It may be also possible to conduct the etching treatment on portions which are contacted to the lead portions of the electrodes which are arranged in order to couple the supporting wires with the electrodes in addition to the above mentioned portions.

The degree of removing the affected layer or the work distortion of the crystal plate is determined by the extent to which the impedance $R_1$ has to be made small. It is most preferable to etch the surfaces of the crystal resonator to the extent that the free surfaces of crystal of the quartz or the natural surfaces of the crystal quartz are exposed. However, as a case may be, there is no influence if the affected layer is partially remained. By the way, the etched surface of the crystal plate appears to be substantially transparent to the eyes. It is found that a lot of smooth and shallow concave surfaces are existent, when the crystal plate is observed with the aid of a microscope. In contrast thereto, the non-etched surface is milk-white, i.e. semi-transparent, and a lot of very fine unevennesses are observed by the microscope. In the thickness shear crystal resonator according to the present invention, it is the important point that the surfaces of the peripheral portion of the crystal plate have natural or free crystalline surfaces. It is not necessary to make the degree that the affected layer are removed same on all of the surfaces where etching should be conducted. For example, in the first embodiment shown in FIGS. 6A and 6B, in case that the etching is conducted on the flat portion located between the beveled portion and the electrodes 12, 13, it may be possible to make the degree of removing the affected layer at the flat portion smaller than that at the beveled portion.

The method of manufacturing the above explained thickness shear crystal resonator of the present invention will be explained in the following.

Figure 10A:
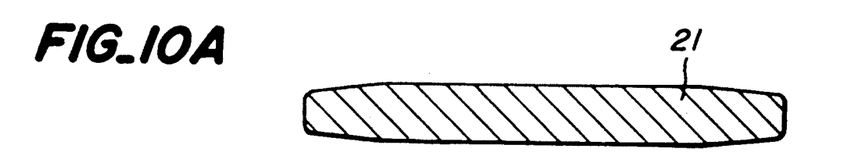
FIGS. 10A, 10B and 10C are cross sectional views showing the successive steps of manufacturing the crystal resonator according to the present invention.
Figure 10B:
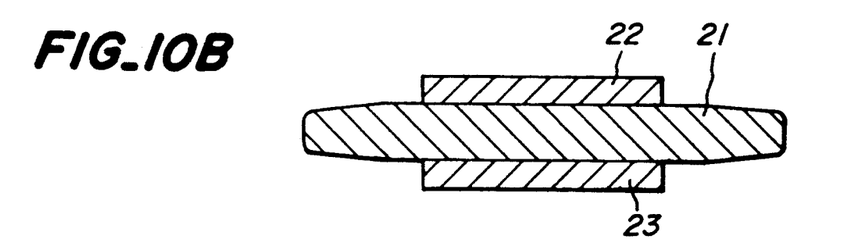
Figure 10C:
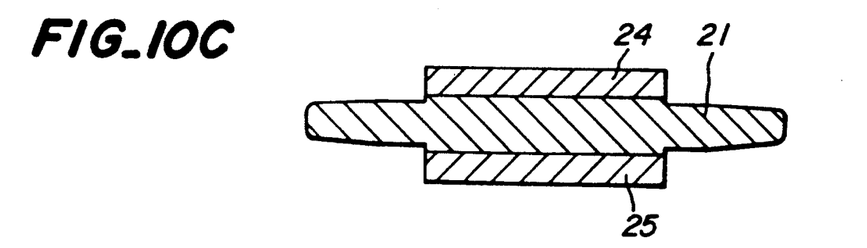

First of all, the thickness shear crystal vibrating plate was made. The diameter of the plate was 8.3 mm, the thickness of 0.26 mm, the frequency of the fundamental wave 6.4 MHz. Secondly, both surfaces of the crystal plate 21 were lapped with the abrasive grains of #4000 and the peripheral edge portion of the crystal plate was beveled up to a position inside from the periphery thereof by 1.4 mm. The plate thus processed is shown in FIG. 10A. Next, paraffin layers 22, 23 were applied on the central portions of the both surfaces of the crystal plate 21 as shown in FIG. 10B. The paraffin layers had a circle shape having the diameter of 5 mm. And the crystal plate 21, on which the paraffin layer 22, 23 were applied was immersed into the liquid of ammonium fluoride at the room temperature for fifteen hours, and a portion of the surfaces not covered with the paraffin layers was chemically etched. Thereafter, the paraffin layers 22 and 23 were removed by using alcohol, and metal electrodes 24, 25 were vacuum evaporated on the front and rear surfaces of the crystal plate as shown in FIG. 10C.

In such manner, thirty eight (38) thickness shear crystal resonators were made, and the impedances thereof were measured at the temperature of 25° C. The minimum impedance of 9.3Ω and the maximum impedance of 17.0Ω were measured, and the average impedance was 11.2Ω. In contrast thereto, the impedances of the forty (40) conventional crystal resonators, on which the etching treatment is not conducted, were measured at the temperature of 25° C. The minimum impedance of 20.1Ω and the maximum impedance of 44.6Ω were measured and the average was 26.6Ω. As a result, it can be said that in the thickness shear crystal resonator according to the present invention, the impedance can be made smaller than that of the conventional crystal resonator by 2 to 2.6 times, so that the Q factor can be made large accordingly.

Figure 11A:
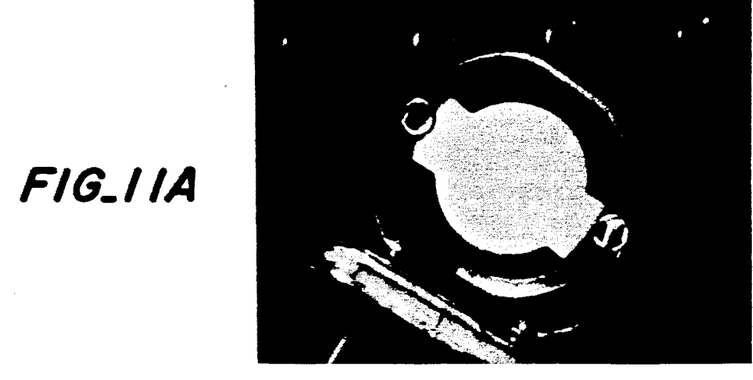
FIGS. 11A, 11B and 11C are optical microscopic photographs showing the crystal plate according to the invention.
Figure 11B:
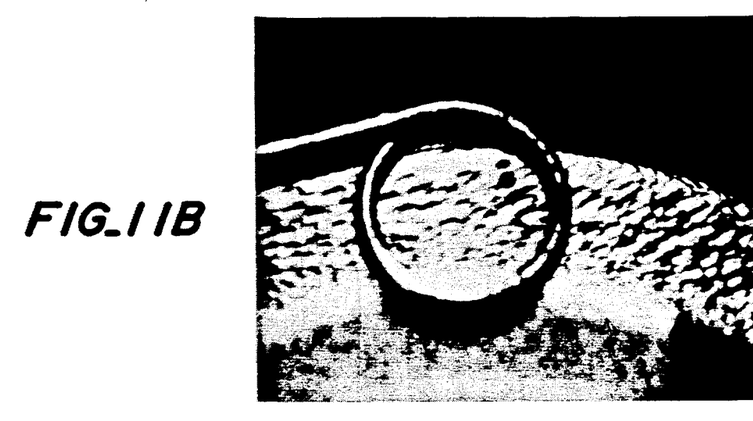
Figure 11C:
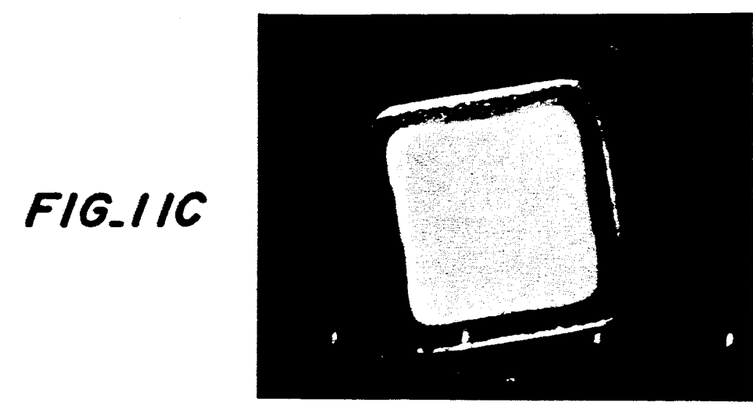
Figure 12A:
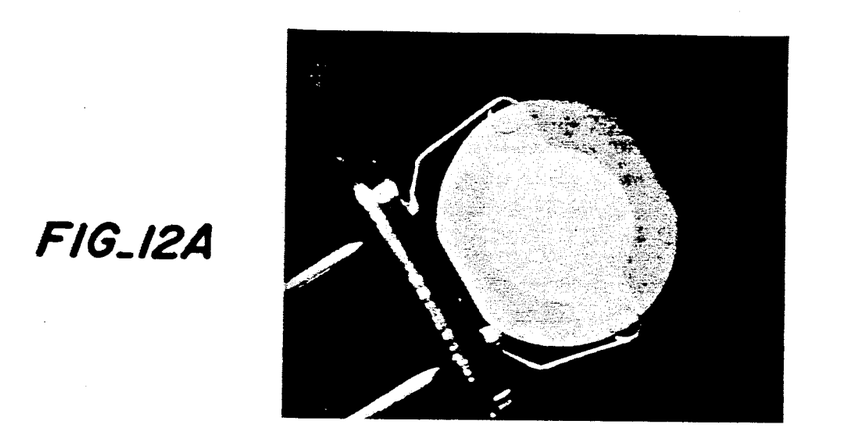
FIGS. 12A, 12B and 12C are optical microscopic photographs of the known crystal plate.
Figure 12B:
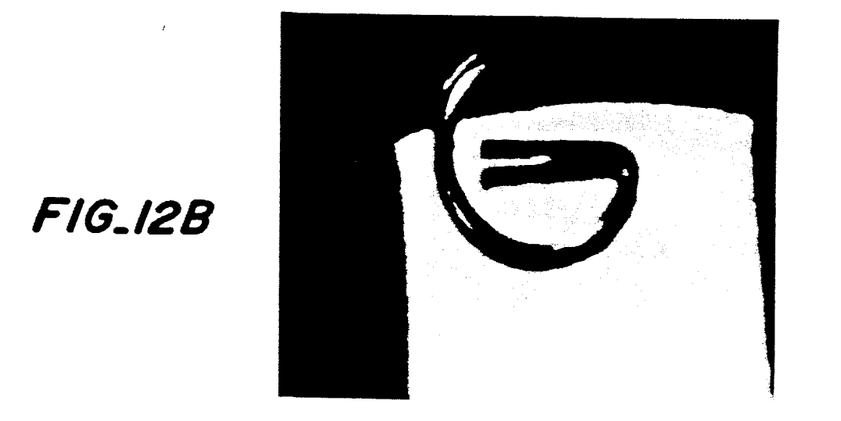
Figure 12C:
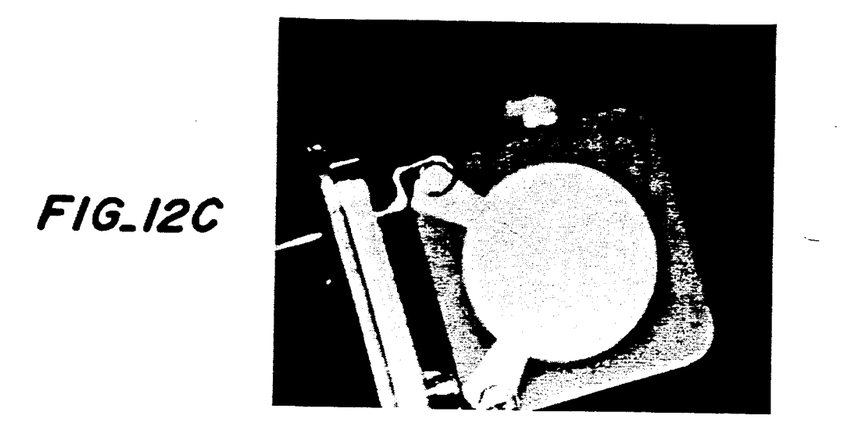

FIGS. 11A, 11B and 11C are photographs showing the crystal resonators according to the invention taken by the optical microscope, and FIGS. 12A, 12B and 12C are photographs illustrating the known crystal resonators also taken by the optical microscope. Upon comparing these photographs with each other, it can be readily understood that in the crystal plate according to the invention, the peripheral portion is transparent, while in the known crystal plate the peripheral portion is translucent or opaque.

Figure 13A:
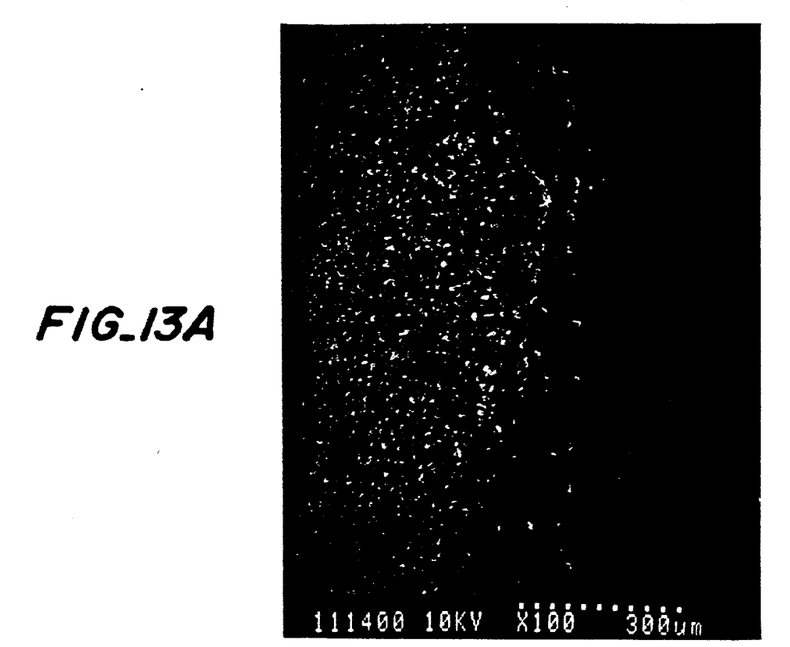
FIGS. 13A, 13B, 13C and 13D are electronic microscopic photographs illustrating the crystal plate according to the invention.
Figure 13B:
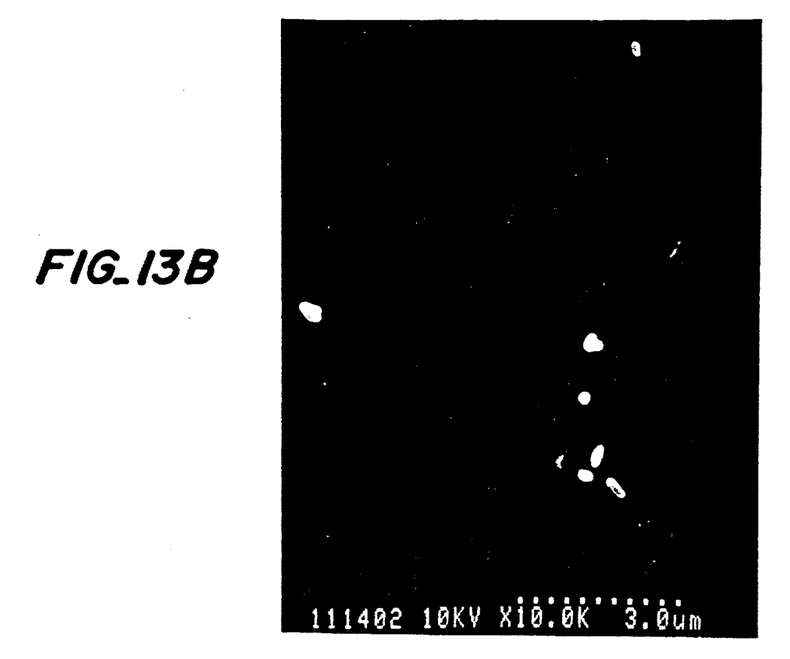
Figure 13C:
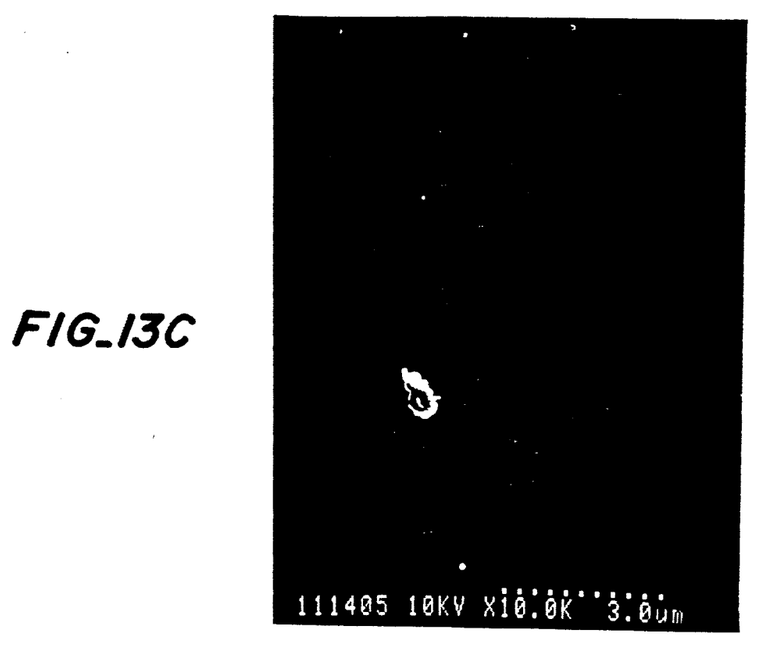
Figure 13D:
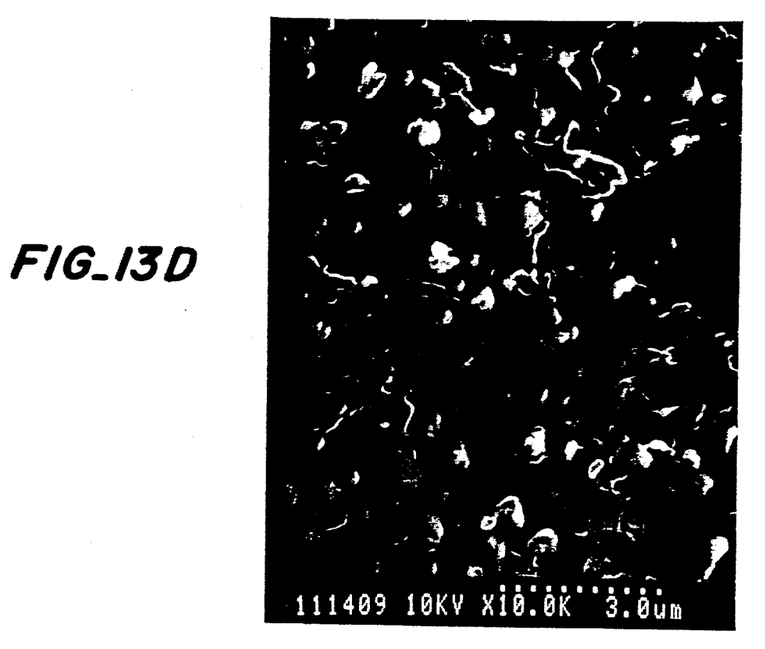

FIGS. 13A~13D are photographs of the crystal plate according to the invention taken by the scanning type electron microscope. The photograph illustrated in FIG. 13A has the magnification of 100 and corresponds to the boundary between the non-etched central portion and the etched peripheral portion. That is to say, the left hand portion corresponds to the lapped, but non-etched central portion and the right hand half denotes the lapped and then etched peripheral portion. FIGS. 13B to 13D are photographs taken at the magnification of 10,000 and the photograph of FIG. 13B shows the non-etched central portion, the photograph of FIG. 13C the etched peripheral portion and the photograph of FIG. 13D represents the boundary portion. In the lapped central portion there are formed a number of depressions due to the mechanical polishing, but the etched peripheral portion such small depressions are removed.

Figure 14:
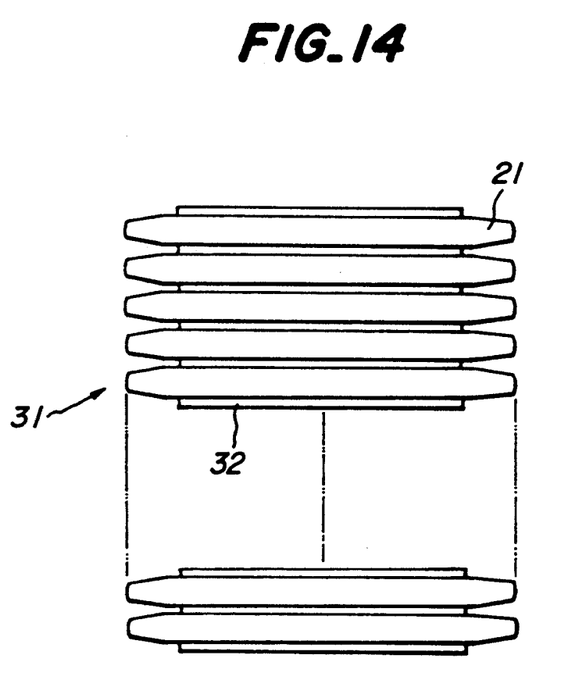
FIG. 14 is a schematic view illustrating the laminated crystal plates according to another embodiment of the method according to the invention.

Another embodiment of the method of manufacturing great amounts of the thickness shear crystal resonators according to the present invention will be explained with reference to FIG. 14.

First of all, a laminated body is formed by assembling several tens to several hundreds crystal plates 21, the surfaces of each plate having been polished and the peripheral portion having been beveled. Secondly, the laminated body is immersed into the heated and melted resist liquid, for example, paraffin liquid. During this process, the resist liquid is introduced sufficiently into spaces formed between adjacent plates. Next, after pulling up the laminated body from the resist liquid and cooling it, the peripheries of the crystal plates constituting the laminated body are wiped by a cloth, into which a component to solve the paraffin is immersed, to obtain a rod-shaped laminated body 21, in which the resist liquid is removed from the peripheral portions of each crystal plate and the central portions thereof are connected to each other by resist layers 32. Further, the laminated body 31 is immersed into the ammonium fluoride liquid at the room temperature to etch the exposed surfaces of the peripheral portions of the crystal plates 21 to such an extent that in the peripheral portions natural or free crystal surfaces are exposed. After the etching is finished, the laminated body 31 is pulled up from the etching liquid and after washing and drying it, the resist layers 32 are removed, so that a lot of crystal plates whose peripheral surfaces are etched are obtained. According to such method, since a lot of crystal plates can be etched at the same time, manufacturing becomes so easy and the cost becomes low.

In the method according to the present invention, the affected layer formed on the peripheral surface of the crystal plate is removed with the aid o the ammonium fluoride liquid, which is generally used for etching the quartz. However, other etching liquids may be used therefor. And, a wax, a pine resin, and a mixture thereof may be used as a resist instead of the paraffin. Furthermore, the physical, thermal, and mechanical method may be used for removing the affected layer from the surfaces of the crystal resonator instead of the chemical etching stated above. For example, the plasma etching method with the aid of $CF_4$ gas, which is widely used for removing $SiO_2$ layer in the process of manufacturing semiconductor integrated circuits, i.e. the reactive gas ion etching method, may be used as the physical etching.

The inventors of the present invention manufactured several crystal resonators each having a square crystal plate of the dimension of 5.4 mm × 5.4 mm, the thickness of 0.20 mm, the frequency of the fundamental wave of 8.33 MHz, and the frequency of the third overtone of 25 MHz, but the crystal plates being etched for different etching times, in order to find how the impedance of the crystal resonator according to the present invention is varied by the etching time. In this experiment, each crystal plate has not been beveled mechanically. The below mentioned Table 1 shows the variation of the impedance of the crystal resonator in accordance with the etching time. As the time for etching is long, the impedance for the fundamental wave is reduced from 96.4Ω to 12.5Ω. That is to say, the impedance is reduced by seven times or more by the etching, the impedance for the third over tone wave is also reduced, but the variation is not so large in comparison with that for the fundamental wave. As apparent from the above, since the impedance becomes small as the time for etching is long, the crystal resonator having a desired impedance can be obtained by selecting the etching time properly.

TABLE 1

|  | Etching time (hour) | | | |
| --- | --- | --- | --- | --- |
|  | 0 | 15 | 30 | 45 |
| Impedance for fundamental wave (8.33 MHz) (Ω) | 96.4 | 22.3 | 15.3 | 12.5 |
| Impedance for third overtone (25 MHz) (Ω) | 26.2 | 25.3 | 24.0 | 23.6 |

As stated above, the impedance of the thickness shear crystal resonator according to the present invention is small, thus, even if the electrodes are made large up to the practically usable size, the large Q factor can be obtained. Also, since only a few dips are found in the temperature characteristics, the crystal resonator works in a stable manner. And, according to the manufacturing method of the present invention, since the expensive manufacturing equipment is not necessary to produce the crystal resonator having high performance, the cost for manufacturing becomes low. Further to the above, according to this method, etching is not conducted on the vibrating surface of the crystal plate where the electrodes are arranged, so that the precision of early processing stages does not get wrong and the desired vibrating frequency can be obtained easily.

What is claimed is:

1. A method of manufacturing a thickness shear crystal resonator comprising the following steps of:
   immersing a lot of thickness shear crystal plates cut to desired shape which are laminated, into a resist liquid to form a mask against a chemical etching and pulling it therefrom;
   removing the resist liquid adhered on peripheral portions of said each crystal plates;
   drying the resist liquid to form a laminated body of crystal plates which are connected to each other at central portions thereof by layers of said resist liquid;
   immersing said laminated body of crystal plates into an etching liquid to conduct an etching treatment on only the peripheral portions of each crystal plates to the extent that free crystal surfaces thereof are substantially exposed on said peripheral portions;
   decomposing the laminated body into separate crystal plates; and
   providing electrodes on both surfaces of said crystal plate.

2. A method according to claim 1, wherein said resist layer removing step includes a step of wiping the peripheral portions of crystal plates in the laminated body with the aid of a cloth in which a solvent for the resist liquid has been immersed.

* * * * *